(12) United States Patent
Roberts

(10) Patent No.: US 6,793,209 B1
(45) Date of Patent: Sep. 21, 2004

(54) MEMS DIE HOLDER

(75) Inventor: Joseph Roberts, Longmont, CO (US)

(73) Assignee: PTS Corporation, San Jose, CA (US)

( * ) Notice: Subject to any disclaimer, the term of this patent is extended or adjusted under 35 U.S.C. 154(b) by 0 days.

(21) Appl. No.: 09/941,325

(22) Filed: Aug. 28, 2001

(51) Int. Cl.⁷ ............................................... B23Q 1/25
(52) U.S. Cl. ..................................................... 269/55
(58) Field of Search .............................. 29/650, 603.17, 29/603.19; 269/55, 56, 57; 414/935, 936, 937, 938, 939, 940, 941

(56) References Cited

U.S. PATENT DOCUMENTS 5,040,484 A * 8/1991 Mears et al. ................. 118/503
6,425,971 B1 * 7/2002 Silverbrook ................. 156/230

* cited by examiner

*Primary Examiner*—Evan Pert
*Assistant Examiner*—Scott B. Geyer
(74) *Attorney, Agent, or Firm*—Townsend and Townsend and Crew LLP

(57) ABSTRACT

A method and article are provided for batch processing of a plurality of MEMS dice. The MEMS dice are secured in a holder having multiple stations adapted to secure a MEMS die. A process step is then performed on the plurality of MEMS dice while they are secured in the holder and may be performed simultaneously on all of the MEMS dice secured in the holder.

24 Claims, 5 Drawing Sheets

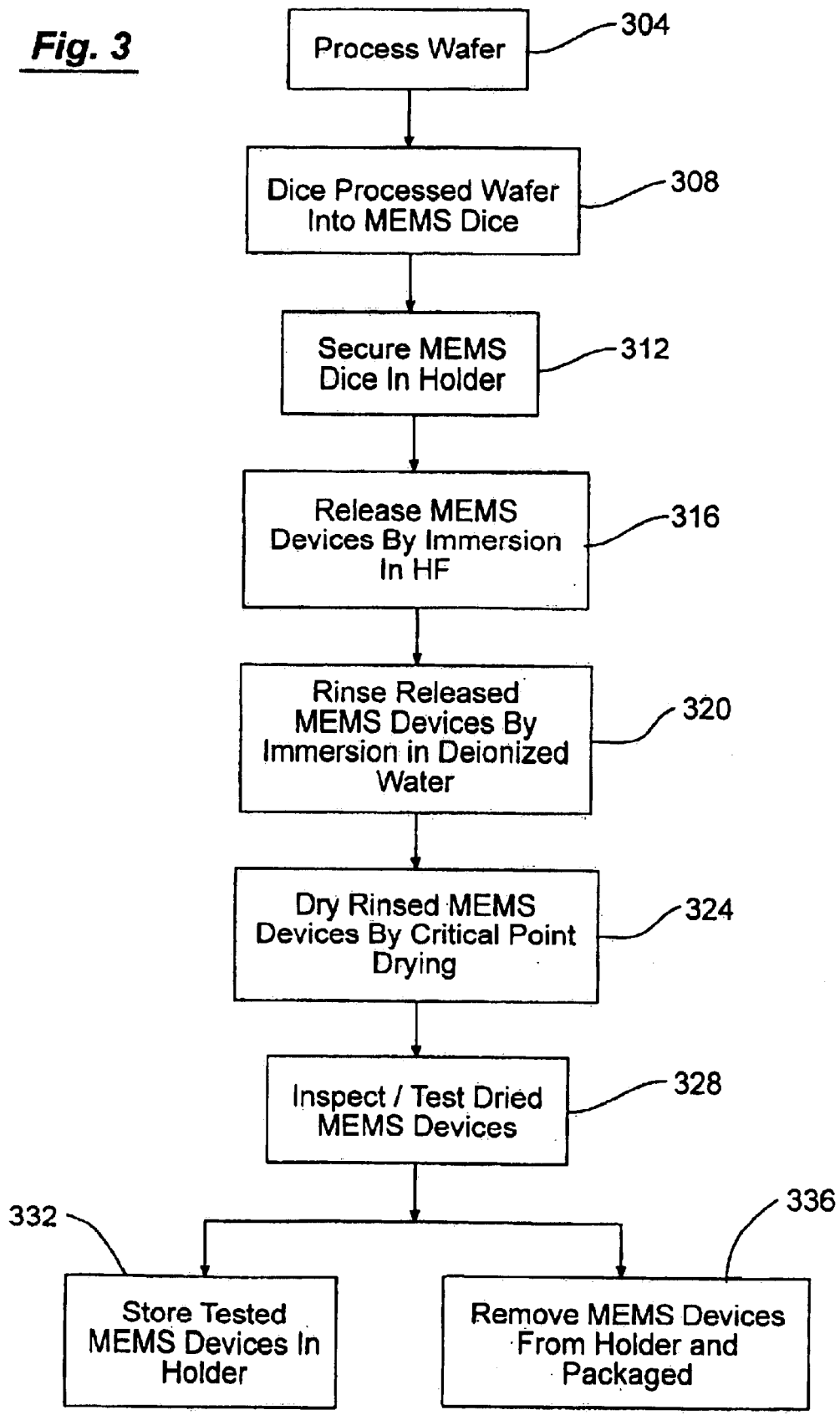

MEMS DIE HOLDER

BACKGROUND OF THE INVENTION

This application relates generally to processing microelectromechanical systems (MEMS), and more particularly to postprocessing of MEMS dice.

In recent years, increasing emphasis has been made on the development of techniques for producing microscopic systems that may be tailored to have specifically desired electrical and/or mechanical properties. Such systems are generically described as microelectromechanical systems (MEMS) and are desirable because they may be constructed with considerable versatility despite their very small size. Much of the development of MEMS processes has taken advantage of developments in the semiconductor processing industry, although there are significant differences.

One difference is that semiconductor processing is typically performed on the scale of wafers. In particular, semiconductor devices are typically formed by a series of deposition and etching steps on a silicon wafer having a diameter of 100 mm, 200 mm, or 300 mm. Many devices are thus formed simultaneously with a single wafer so that economies can be realized from the batch processing. By contrast, in MEMS processing, only a portion of the process is performed at the wafer scale. A MEMS device is formed through initially depositing structural and sacrificial layers on a wafer, both of which may be etched in specific ways as part of the process. Subsequently, the structures are diced using a 75- to 250-μm-wide diamond or carbide saw blade and the MEMS devices are "released" through immersion in a substance corrosive to the sacrificial layers. Typically the sacrificial layers are formed of silicon oxide, which is dissolved through immersion of individual dice in hydrofluoric acid (HF). Each die, after immersion in hydrofluoric acid, is then rinsed, for example in a bath of deionized water. Because these processes are performed individually, MEMS processing does not realize the same economies of scale available in semiconductor processing. Additionally, since the release and rinses are typically performed by holding an individual die with tweezers, there is a significant risk of accidental damage to the delicate device.

This risk of accidental damage is further increased because MEMS devices are generally not passivated prior to the release and rinse steps in the formation process. This is in contrast to semiconductor devices, which are generally passivated to promote the formation of a resistant layer that provides some level of protection during handling. Since the MEMS devices are unpassivated, they are especially sensitive to surface contact that may damage the silicon layers used to form the device. In addition, for the same reasons, they are more susceptible to harmful effects from debris and contamination than are semiconductor devices.

After the release and rinsing steps, the MEMS dice are packaged. Because these post-dicing processing steps cannot take advantage of the large-scale integration used in the semiconductor-processing industry, their cost may be considerable. It is not unusual for the post-dicing processing of MEMS devices to account for as much as 80% of the overall cost of a component or system. There is accordingly a need in the art for a method and apparatus that provides for batch processing of MEMS dice and that limits contact with a human handler.

SUMMARY OF THE INVENTION

Thus, embodiments of the invention provide a method for processing a plurality of MEMS dice, such as may be prepared by dicing a processed wafer. The plurality of MEMS dice are secured in a holder. A process step is then performed on the plurality of MEMS dice while they are secured in the holder. Such a process step may be performed simultaneously on all of the MEMS dice secured in the holder. In one embodiment, the plurality of MEMS dice include unreleased MEMS dice.

A variety of processing steps may be performed. For example, the holder may be immersed in one or more liquids, thereby immersing all of the MEMS dice secured by the holder in the liquid. One liquid may be hydrofluoric acid, which is corrosive to silicon oxide layers commonly used as sacrificial material in fabricating MEMS devices, so that the immersion in hydrofluoric acid acts to release the MEMS devices. The holder may thus be made of a material resistant to corrosion by hydrofluoric acid, such as the fluoropolymer resin teflon®. Another liquid may be used to rinse hydrofluoric acid after release, such as deionized water. Another processing step that may be performed while the MEMS dice are secured in the holder is critical point drying to prevent damage to the delicate structures after rinsing. Other process steps that may be performed include testing the plurality of MEMS dice, as well as some steps involved in packaging the MEMS dice.

In one embodiment, the holder comprises a structural body having a plurality of stations. Each station is adapted to secure a MEMS die. In one embodiment, this is achieved with a recess in the structural body shaped to secure an edge of the MEMS die together with a flexible retaining arm adapted to retain the MEMS die within the recess. The flexible retaining arm may include a notch shaped for engagement with a tool for flexing the flexible retaining arm. Each station may also include an access to an underside of the MEMS die, as may be provided with a hole or slot in the structural body. In one embodiment, the structural body is circularly symmetric and the plurality of stations are configured symmetrically about a central axis of the structural body. The structural body may be formed as a single continuous structure.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and is enclosed in parentheses to denote one of multiple similar components. When reference is made to a reference numeral without specification to an existing sublabel, it is intended to refer to all such multiple similar components.

FIG. 3 is a flow diagram illustrating a method according to the invention for processing MEMS dice.

DETAILED DESCRIPTION OF THE INVENTION

Embodiments of the invention are directed to a method and article used for processing of MEMS dice. The article includes a structural body having a plurality of stations, each of which is adapted to secure a microelectromechanical system. With such an article, it is possible to process a plurality of MEMS dice in a batch process while simultaneously limiting the risk of damage or contamination of the MEMS devices.

Figure 1:
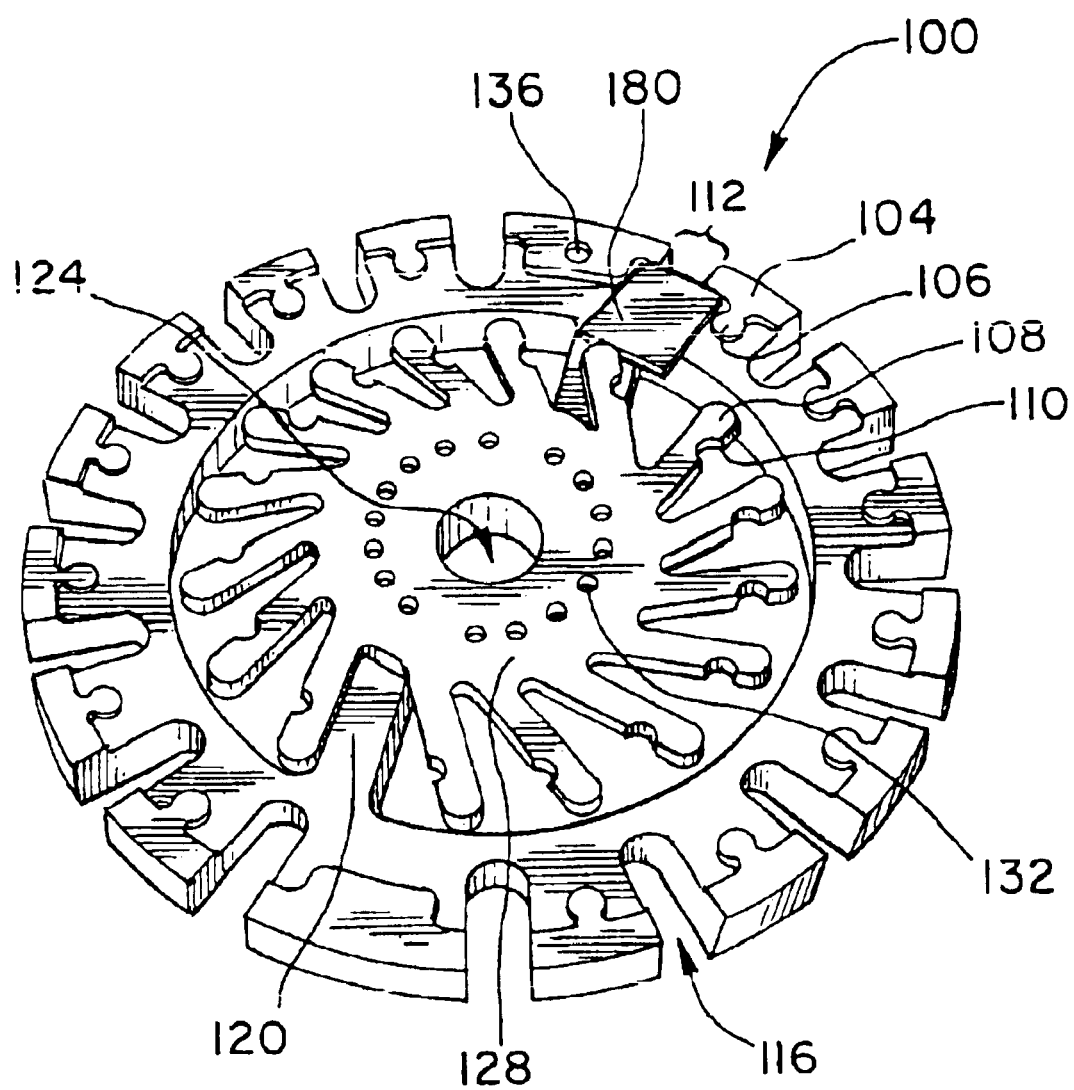
FIG. 1 is a perspective drawing of one embodiment of a MEMS die holder according to the invention.

One embodiment of the article is illustrated with a perspective view in FIG. 1. In this embodiment, the article 100 is fabricated as a continuous structure, such as maybe machined from a block of material. In alternative embodiments, the article 100 may be manufactured from multiple components that are subsequently bonded together. In applications where the article will be exposed to corrosive materials such as hydrofluoric acid, it may be manufactured from materials resistant to corrosion. One appropriate material for such purposes is a fluoropolymer resin such as teflon®, which is resistant to corrosion by hydrofluoric acid.

The continuous-structure embodiment shown in FIG. 1 is configured with circular symmetry, although other shapes may alternatively be used. For an article 100 configured to hold sixteen MEMS dice (as shown) having dimensions on the order of 1 $cm^2$, a diameter for the article on the order of 10 cm is appropriate. A plurality of stations 112 are defined by a series of protrusions 104 formed around the periphery of the structural body of the article 100. In other embodiments, the plurality of stations may be formed elsewhere on the structural body. Each station in the illustrated embodiment is bounded by a pair of protrusions 104 and protuberances 106 that extend from the protrusions 104. A recess within the structural body is thereby provided and shaped to secure an edge of the MEMS die 180, an example of which is shown in FIG. 1 at station 112.

Radiating from a central portion 128 of the structural body are a plurality of flexible retaining arms 108. In the illustrated embodiment, one retaining arm 108 is provided for each station 112, although in other embodiments, different numbers of retaining arms or different retaining configurations may be used. Where the article 100 is formed of a material such as teflon®, a good balance between flexibility and structural integrity is achieved with widths for the retaining arms of about 3–6 mm. In one embodiment, each arm 108 includes a notch 110, which provides additional flexibility to the arm 108; in addition, as described below, the notch may be configured to engage a tool used to free the MEMS die 112 from the article 100 when desired. When the MEMS die 180 is secured in the recess at the station 112, the flexible retaining arm 108 is pressed against the MEMS die 180 as shown in FIG. 1 to retain the MEMS die 180 in its position in the station 112.

Access is provided to an underside of each MEMS die 180 when positioned in the station 112 to facilitate manipulation and removal of the die 180 without making contact with a top surface of the die 180. In the embodiment shown in FIG. 1, such access is provided with a slot 116 in the structural body at each station 112. Alternatively, a hole may be provided through the structural body at each station to provide such access.

Other features of the article 100 shown in FIG. 1 include members 120 to provide structural support between the periphery of the article 100 and the central portion 128 as well as various holes through the structural body. Hole 136 may be used as an index hole for noting die order if necessary. A plurality of holes 132 is provided to correspond to each of the stations 112 and may be used to position the article relative to a particular station 112 for certain applications. Thus, for example, in an application where each die is to be treated sequentially, the article 100 may be rotated by an amount determined by the relative position of holes 132 so that the position between the station 112 and the processing apparatus is fixed. The hole 124 at the center of the article 100 may be used to attach a variety of tools and implements for manipulating the article 100. Some applications illustrating the use of such tools and implements are described below.

Figure 2A:
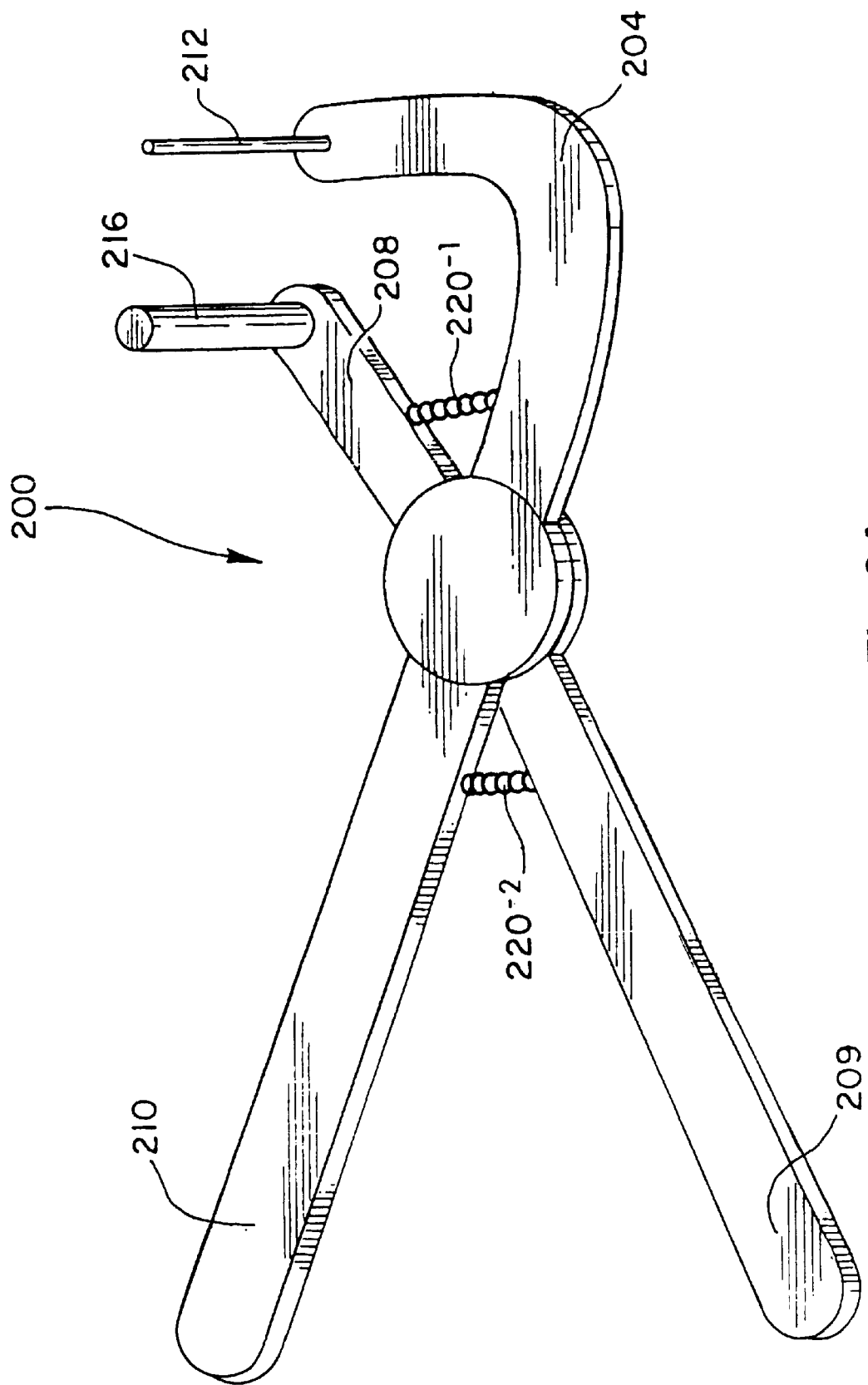
FIG. 2A is a perspective drawing of an opener tool that-may be used with the MEMS die holder.

FIG. 2A shows a perspective drawing of an opener tool 200 configured for use with the article 100. The opener tool 200 includes a pair of handles 209 and 210 provided with a resisting force by a first spring 220-2. It also includes a pair of members 204 and 208 provided with a resisting force by a second spring 220-1. Member 216 includes a first post 216 sized to fit the central hole 124 of the article 100. Member 204 similarly includes a second post 212 sized to engage one of the notches 110 of the flexible retaining arms 108 of the article 100. In a rest position of the opener tool 200 resulting from the forces of springs 220, the separation between the first post 216 and the second post 212 corresponds to the separation of notches 110 from the central hole 124 in the article.

The opener tool 200 is used to open a station 112 on the article 100 for insertion or removal of a MEMS die 180 by retracting the corresponding flexible retaining arm 108. After positioning the first post 216 within the central hole 124 and engaging the second post 212 with the desired notch 110, the handles 209 and 210 are engaged to retract the flexible retaining arm 108. After inserting or removing the die 180, the handles 209 and 210 are disengaged to return the flexible retaining arm 108 to its retaining position.

Figure 2B:
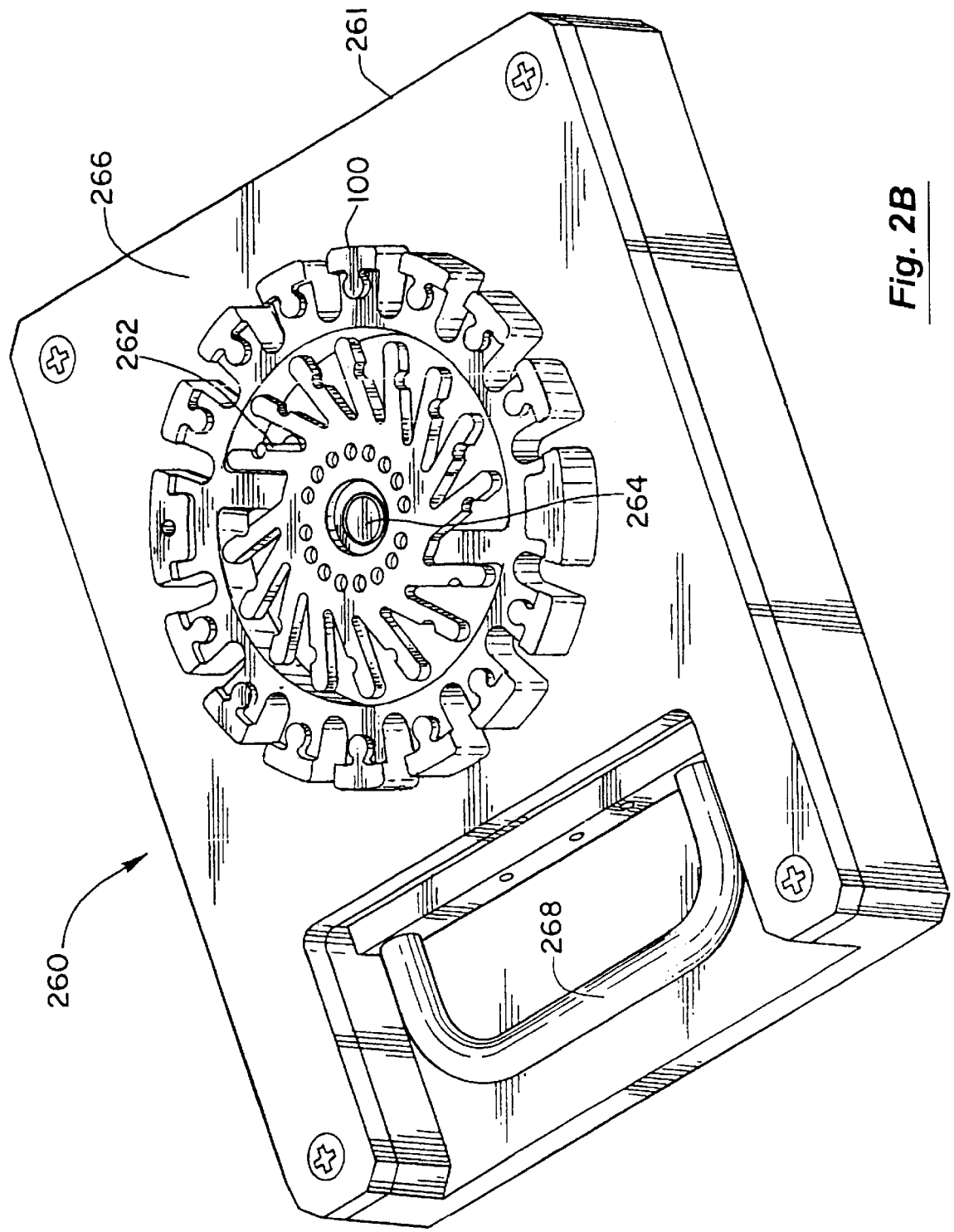
FIG. 2B is a perspective drawing of a die insertion tool that may be used with the MEMS die holder.

An alternative to the opener tool 200 is the die insertion tool 260 shown in perspective view in FIG. 2B. In this embodiment, an enclosure 261 having a flat surface 266 on which the article 100 may be placed is provided. The die insertion tool 260 further comprises a center post 264 sized to fit the central hole 124 of the article 100 and an arm post 262 sized to engage one of the notches 110 of the flexible retaining arms 108 of the article 100. One of the center post 264 and the arm post 262 is mechanically engaged with a handle 268. In a rest position, the separation between the center post 264 and arm post 262 is substantially equal to the separation of the central hole 124 from each of the notches 110 of the article. Movement of the handle 268 creates a separation force that opens a station 112 on the article for insertion or removal of a MEMS die. The general function of the die insertion tool 260 is thus similar to the operer tool 200 in that it provides a mechanism for opening the stations 112 on the article 100 for insertion or removal of MEMS dice.

Figure 2C:
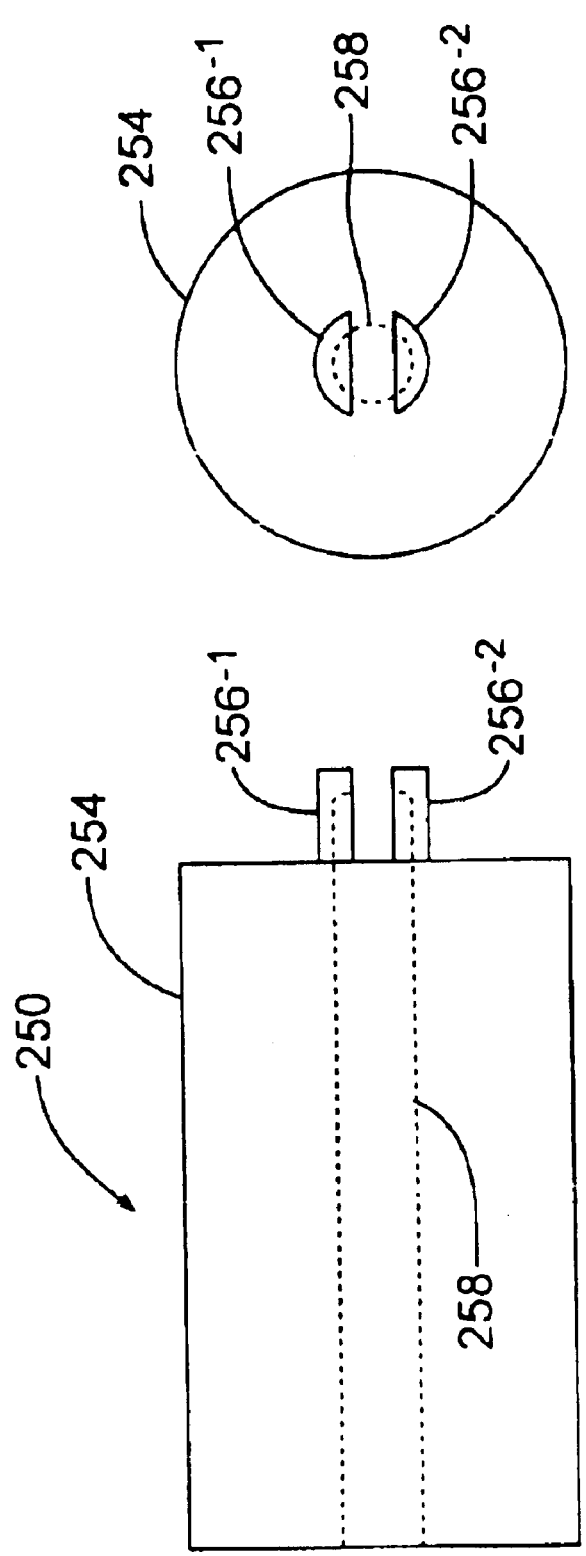
FIG. 2C is an orthographic projection drawing of a handle that may be used with the MEMS die holder.

FIG. 2C shows an orthographic projection of a handle 250 configured for use with the article 100, with the left portion of the figure showing a side view and the right portion of the figure showing a top view. A body 254 is provided with a bore 258 and a pair of struts 256 shaped so that the struts 256 may engage the central hole 124 of the article 100. In one embodiment, the handle 250 is made of the same material as the article 100 to permit exposure of the handle 250 to the same substances as the article. For example, where the article 100 is to be immersed in hydrofluoric acid, the handle 250 may be composed of a fluoropolymer resin resistant to corrosion by HF, such as teflon®. The handle 250 shown in FIG. 2B may be inserted into the central hole 124 of the article 100 either from the front or back to allow for inverted processing if desired.

One example of a method for batch processing of MEMS dice using the article 100 is illustrated as a flowchart in FIG. 3. The illustrated process is merely exemplary and numerous deviations from or modifications of such a process that use the article 100 will occur to those of skill in the art.

A wafer is initially processed at step 304 through a combination of steps of deposition, patterning, and etching. The initially processed wafer is then diced at step 308 into a plurality of MEMS dice. At this stage of the process, the MEMS dice are unreleased. The dice are secured within the article 100 at step 312 and the MEMS devices are subsequently released at step 316 by immersing the article 100 holding the MEMS dice in hydrofluoric acid to dissolve the sacrificial material. Step 316 may be performed, for example, be attaching the handle 250 to the article 100 as described above to immerse the article 100. The MEMS devices are subsequently rinsed by immersion in deionized-water at step 320. This rinsing step may comprise a plurality of immersions in multiple deionized-water baths.

The released and rinsed MEMS devices may be subjected to a step of critical point drying at step 324 as part of a batch process. As known to those of skill in the art, critical point drying is a technique used for drying wet, fragile specimens that avoids the damage caused to surfaces when allowed to dry in air or under vacuum. To avoid the large surface-tension forces created in cavities of small dimensions when there is a liquid-gas interface, critical point drying operates at a point on the phase diagram where such liquid-gas interfaces cannot form. This is achieved with a chamber having controlled temperature and pressure to remain at the desired phase-diagram position during drying. After the released MEMS devices have been dried, they may be inspected and or tested at step 328 to ensure that the desired properties of the devices have been achieved.

Two possible alternatives are then illustrated as steps 332 and 336. At step 332, the article 100 is used as a storage device to store the MEMS devices. Such a storage step may alternatively be used elsewhere in the general process. For example, the article 100 may be used to store unreleased MEMS dice after step 312 or it may be used to store released MEMS dice prior to inspection and testing after step 324.

Alternatively, at step 336, individual MEMS devices are removed from the article 100 and packaged. While a variety of techniques are known for packaging, their specific features being characteristic of properties of the individual devices, certain elements of packaging tend to be common. For example, one or more dice may be attached to a ceramic, a metal header, or a premolded plastic lead frame. Electrical interconnects may then be made with the device by a technique such as wire bonding, flip-chip, or other method. The assembly may then be sealed with a ceramic, metal, or plastic cap. Alternatively, the die or dice may be attached to a metal lead frame. After the electrical interconnects are made, plastic is molded over the assembly. A final test and calibration conclude the process. In some instances, one or more of such steps may be performed while the MEMS devices remain held within the article 100.

Having described several embodiments, it will be recognized by those of skill in the art that various modifications, alternative constructions, and equivalents may be used without departing from the spirit of the invention. Accordingly, the above description should not be taken as limiting the scope of the invention, which is defined in the following claims.

What is claimed is:

1. An article comprising:
   a structural body having a plurality of stations, each such station being adapted to secure a microelectromechanical-systems (MEMS) die;
   a recess within the structural body shaped to secure an edge of the MEMS die; and
   a flexible retaining arm adapted to retain the MEMS die within the recess, wherein the flexible retaining arm includes a notch shaped for engagement with a tool for flexing the flexible retaining arm.

2. The article recited in claim 1 wherein each such station includes an access to an underside of the MEMS die.

3. The article recited in claim 2 wherein the access comprises a hole in the structural body.

4. The article recited in claim 2 wherein the access comprises a slot in the structural body.

5. The article recited in claim 1 wherein the structural body is circularly symmetric and the plurality of stations are configured symmetrically about a central axis of the structural body.

6. The article recited in claim 1 wherein the article is formed as a single continuous structure.

7. The article recited in claim 6 wherein the article is formed of a fluoropolymer resin.

8. An article comprising:
   a structural body having a plurality of means for securing a microelectromechanical-systems (MEMS) die, wherein each such means for securing includes a flexible means for retaining the MEMS die within a recess in the structural body; and
   a MEMS die secured within one of the means for securing.

9. The article recited in claim 8 wherein the structural body is circularly symmetric and the plurality of means for securing are configured symmetrically about a central axis of the structural body.

10. An article comprising:
    a structural body having a plurality of stations, each such station being adapted to secure a microelectromechanical-systems (MEMS) die;
    a recess within the structural body shaped to secure an edge of the MEMS die; and
    a flexible retaining arm adapted to retain the MEMS die within the recess, wherein the article is formed as a single continuous structure.

11. The article recited in claim 10 wherein the flexible retaining arm includes a notch shaped for engagement with a tool for flexing the flexible retaining arm.

12. The article recited in claim 10 wherein each such station includes an access to an underside of the MEMS die.

13. The article recited in claim 12 wherein the access comprises a hole in the structural body.

14. The article recited in claim 12 wherein the access comprises a slot in the structural body.

15. The article recited in claim 10 wherein the article is circularly symmetric and the plurality of stations are configured symmetrically about a central axis of the structural body.

16. The article recited in claim 10 wherein the article is formed of a fluoropolymer resin.

17. An article comprising:
    a structural body having a plurality of stations, at least one such station securing a microelectromechanical-systems (MEMS) die;

a recess within the structural body shaped to secure an edge of the MEMS die; and a retaining arm positioned to retain the MEMS die within the recess.

18. The article recited in claim 17 wherein the flexible retaining arm includes a notch shaped for engagement with a tool for flexing the flexible retaining arm.

19. The article recited in claim 17 wherein each such station includes an access to an underside of the MEMS die.

20. The article recited in claim 19 wherein the access comprises a hole in the sructural body.

21. The article recited in claim 19 wherein the access comprises a slot in the structural body.

22. The article recited in claim 17 wherein the article is circularly symmetric and the plurality of stations are configured symmetrically about a central axis of the structural body.

23. The article recited in claim 17 wherein the article is formed as a single continuous structure.

24. The article recited in claim 23 wherein the article is formed of a fluoropolymer resin.

* * * * *